United States Patent
Mitra et al.

(10) Patent No.: US 9,748,421 B2
(45) Date of Patent: Aug. 29, 2017

(54) MULTIPLE CARBON NANOTUBE TRANSFER AND ITS APPLICATIONS FOR MAKING HIGH-PERFORMANCE CARBON NANOTUBE FIELD-EFFECT TRANSISTOR (CNFET), TRANSPARENT ELECTRODES, AND THREE-DIMENSIONAL INTEGRATION OF CNFETS

(75) Inventors: Subhasish Mitra, Palo Alto, CA (US); Nishant P. Patil, Mountain View, CA (US); Chung Chun Wan, Fremont, CA (US); H.-S. Philip Wong, Stanford, CA (US)

(73) Assignee: THE BOARD OF TRUSTEES OF THE LELAND STANFORD JUNIOR UNIVERSITY, Palo Alto, CA (US)

( * ) Notice: Subject to any disclaimer, the term of this patent is extended or adjusted under 35 U.S.C. 154(b) by 924 days.

(21) Appl. No.: 12/718,418

(22) Filed: Mar. 5, 2010

(65) Prior Publication Data
US 2011/0133284 A1 Jun. 9, 2011

Related U.S. Application Data

(60) Provisional application No. 61/266,798, filed on Dec. 4, 2009.

(51) Int. Cl.
*H01L 31/0352* (2006.01)
*B08B 7/00* (2006.01)
(Continued)

(52) U.S. Cl.
CPC .... *H01L 31/035281* (2013.01); *B08B 7/0035* (2013.01); *B82Y 10/00* (2013.01);
(Continued)

(58) Field of Classification Search
CPC .. B82Y 10/00; H01L 51/003; H01L 21/02527
(Continued)

(56) References Cited

U.S. PATENT DOCUMENTS 6,486,549 B1 * 11/2002 Chiang .................. 257/723
2008/0226217 A1 * 9/2008 Kilic et al. .................. 385/12
(Continued)

OTHER PUBLICATIONS

Wei, H., et al., "Monolithic Three-Dimensional Integrated Circuits using Carbon Nanotube FETs and Interconnects," 2009 IEEE International Electron Devices Meeting (IEDM), Dec. 7-9, 2009.
(Continued)

*Primary Examiner* — Laura Menz
*Assistant Examiner* — Candice Y Chan
(74) *Attorney, Agent, or Firm* — Saliwanchik, Lloyd & Eisenschenk (57) ABSTRACT

A wafer-scale multiple carbon nanotube transfer process is provided. According to one embodiment of the invention, plasma exposure processes are performed at various stages of the fabrication process of a carbon nanotube device or article to improve feasibility and yield for successive transfers of nanotubes. In one such carbon nanotube transfer process, a carrier material is partially etched by a plasma process before removing the carrier material through, for example, a wet etch. By applying the subject plasma exposure processes, fabrication of ultra-high-density nanotubes and ultra-high-density nanotube grids or fabrics is facilitated. The ultra-high-density nanotubes and ultra-high-density nanotube grids or fabrics fabricated utilizing embodiments of the invention can be used, for example, to make high-performance carbon nanotube field effect transistors (CNFETs) and low cost, highly-transparent, and low-resistivity electrodes for solar cell and flat panel display applications. Further, three-dimensional CNFETs can be provided by utilizing the subject plasma exposure processes.

2 Claims, 3 Drawing Sheets (51) Int. Cl.
 B82Y 10/00 (2011.01)
 B82Y 30/00 (2011.01)
 B82Y 40/00 (2011.01)
 H01L 51/00 (2006.01)
 H01L 27/28 (2006.01)
 H01L 51/05 (2006.01)

(52) U.S. Cl.
 CPC .............. *B82Y 30/00* (2013.01); *B82Y 40/00* (2013.01); *H01L 51/003* (2013.01); *H01L 51/0013* (2013.01); *H01L 51/0558* (2013.01); *H01L 27/283* (2013.01); *H01L 51/0048* (2013.01); *H01L 51/0541* (2013.01); *Y02E 10/549* (2013.01); *Y02P 70/521* (2015.11)

(58) Field of Classification Search
 USPC .......................................... 977/742–752, 842
 See application file for complete search history.

(56) References Cited

U.S. PATENT DOCUMENTS

| | | | | |
|---|---|---|---|---|
| 2010/0024560 | A1* | 2/2010 | Shcheglov | 73/649 |
| 2010/0127242 | A1* | 5/2010 | Zhou et al. | 257/24 |
| 2010/0133511 | A1* | 6/2010 | Zhou et al. | 257/24 |

OTHER PUBLICATIONS

Kang, S.J., et al., "Printed Multilayer Superstructures of Aligned Single-Walled Carbon Nanotubes for Electronic Applications," Nano Letters, vol. 7, No. 11, 2007, pp. 3343-3348.

Borkar, S., "3D Integration for Energy Efficient System Design," Symposium on VLSI Technology Digest of Technical Papers, 2009, pp. 58-59.

Liu, F., et al., "A 300-mm Wafer-Level Three-Dimensional Integration Scheme Using Tungsten Through-Silicon Via and Hybrid Cu-Adhesive Bonding," 2008 IEEE International Electron Devices Meeting (IEDM), Dec. 15-17, 2008, pp. 1-4.

Lin, M., et al., "Performance Benefits of Monolithically Stacked 3D-FPGA," Proc. International Symposium on Field Programmable Gate Arrays (FPGA '06), 2006, pp. 113-122.

Guo, J., et al., "Performance Analysis and Design Optimization of Near Ballistic Carbon Nanotube Field-Effect Transistors," IEEE International Electron Devices Meeting, 2004. IEDM Technical Digest, pp. 703-706.

Patil, N., et al., "Circuit-Level Performance Benchmarking and Scalability Analysis of Carbon Nanotube Transistor Circuits," IEEE Transactions of Nanotechnology, vol. 8, No. 1, Jan. 2009, pp. 37-45.

Patil, N., et al., "Integrated Wafer-Scale Growth and Transfer of Directional Carbon Nanotubes and Misaligned-Carbon-Nanotube-Immune Logic Structures," 2008 Symposium on VLSI Technology, Jun. 17-19, 2008, pp. 205-206.

Patil, N., et al., "Design Methods for Misaligned and Mispositioned Carbon-Nanotube Immune Circuits," IEEE Transactions on Computer-Aided Design of Integrated Circuits and Systems, vol. 27, No. 10, Oct. 2008, pp. 1725-1736.

Patil, N., et al., "Wafer-Scale Growth and Transfer of Aligned Single-Walled Carbon Nanotubes," IEEE Transactions on Nanotechnology, vol. 8, No. 4, Jul. 2009, pp. 498-504.

Wong, A., et al., "Monolithic 3D Integrated Circuits," International Symposium on VLSI Technology, Systems and Applications (VLSI-TSA) 2007, Apr. 23-25, 2007, pp. 1-4.

Kang, S.J., et al., "High-Performance Electronics Using Dense, Perfectly Aligned Arrays of Single-Walled Carbon Nanotubes," Nature Nanotechnology, vol. 2, Apr. 2007, pp. 230-236.

Collins, P.C., et al., "Engineering Carbon Nanotubes and Nanotube Circuits Using Electrical Breakdown," Science, vol. 292, Apr. 27, 2001, pp. 706-709.

Lin, A., et al., "Threshold Voltage and On-Off Ratio Tuning for Multiple-Tube Carbon Nanotube FETs," IEEE Transactions on Nanotechnology, vol. 8, No. 1, Jan. 2009, pp. 4-9.

LeMieux, M.C., et al., "Self-Sorted, Aligned Nanotube Networks for Thin-Film Transistors," Science, vol. 321, Jul. 4, 2008, pp. 101-104.

Lin, A., et al., "A Metallic-CNT-Tolerant Carbon Nanotube Technology Using Asymmetrically-Correlated CNTs (ACCNT)," 2009 Symposium on VLSI Technology, Jun. 16-18, 2009, pp. 182-183.

Patil, N., et al., "VMR: VLSI-Compatible Metallic Carbon Nanotube Removal for Imperfection-Immune Cascaded Multi-Stage Digital Logic Circuits using Carbon Nanotube FETs," 2009 IEEE International Electron Devices Meeting (IEDM), Dec. 7-9, 2009, pp. 1-4.

\* cited by examiner

MULTIPLE CARBON NANOTUBE TRANSFER AND ITS APPLICATIONS FOR MAKING HIGH-PERFORMANCE CARBON NANOTUBE FIELD-EFFECT TRANSISTOR (CNFET), TRANSPARENT ELECTRODES, AND THREE-DIMENSIONAL INTEGRATION OF CNFETS

CROSS-REFERENCE TO RELATED APPLICATION

This application claims the benefit of U.S. 61/266,798, filed on Dec. 4, 2009, which is hereby incorporated by reference in its entirety (including all tables, figures, and other associated data).

This invention was made with Government support under Contract No. HR0011-07-3-0002 awarded by the Defense Advanced Research Projects Agency and under Contract No. 0702343 awarded by the National Science Foundation. The Government has certain rights in this invention.

BACKGROUND OF THE INVENTION

Carbon nanotubes are an allotrope of carbon having a hollow cylindrical structure, structurally resembling a hexagonal lattice of carbon rolled into a cylinder. In addition to their mechanical properties and small size, carbon nanotubes exhibit remarkable electrical properties, providing great potential for their use in electrical and electronic applications such as sensors, semiconductor devices, displays, conductors and energy conversion devices.

Depending on their chemical structure, carbon nanotubes can be used as an alternative to organic or inorganic semiconductors as well as conductors. Specifically, carbon nanotubes exhibit either metallic or semiconductor properties depending on their chiralities.

Interest in carbon nanotubes for use as a semiconductor material for electronic applications continues to grow due to their demonstrated carrier mobilities being magnitudes higher than silicon.

Indeed, carbon nanotubes represent an emerging research area. In addition to their applications to field effect transistors (FETs), organic solar cells, sensors, and energy conversion devices such as fuel cells, carbon nanotubes can be applicable to a variety of materials including composites (polymer and cement), fire-retardant materials, and UV-protecting textile and filters.

In order to make devices out of nanotubes, it is important to be able to manipulate the nanotubes in a controlled way. For example, transistors are the basic building blocks of integrated circuits. Therefore, research has been conducted to make transistors from carbon nanotubes. Multi-wall and single-wall nanotubes have been used as the channel of a FET with single-walled nanotubes being more popular in the present designs due to their electric properties.

One approach to the formation of large scale multilayer structures of single-walled nanotubes (SWNTs) on a variety of substrates involves the guided growth of aligned arrays or random networks on a growth substrate and then the physical transfer of the nanotubes in multiple, sequential steps onto a target substrate. Presently, a double transfer of SWNTs onto a target substrate has been demonstrated. However, research continues in order to provide improved techniques that are suitable for more than two transfers onto a target substrate. Accordingly, there exists a need in the art for wafer-scale multiple transfer of carbon nanotubes from a source substrate to a target substrate.

BRIEF SUMMARY

The invention provides methods for multiple transfers of as-grown carbon nanotubes onto a target substrate. In one embodiment, techniques are provided that can be applied to the production of ultra-high density nanotubes and nanotube grids or fabrics. According to certain embodiments of the invention, plasma exposure processes are performed at various stages of the fabrication process to improve feasibility and yield for successive transfers of nanotubes.

The ultra-high-density nanotubes fabricated utilizing the plasma exposure processes of the invention can be used to make very high performance carbon nanotube field effect transistors (CNFETs). In addition, the nanotube grids or fabrics fabricated utilizing the plasma exposure processes of the invention can be used for low-cost, highly-transparent, and low resistivity metal electrodes for solar cell and flat panel display applications.

In a further embodiment, by alternating nanotube transfer and inter-layer dielectric deposition or sputtering, three-dimensional integration of CNFETs is achieved.

BRIEF DESCRIPTION OF THE DRAWINGS

The details of one or more embodiments are set forth in the accompanying drawings and the description below. Other features will be apparent from the description and drawings, and from the claims.

DETAILED DISCLOSURE

A wafer-scale multiple carbon nanotube transfer process is provided. According to one embodiment of the invention, plasma exposure processes are performed at various stages of the fabrication process of a carbon nanotube device or article to improve feasibility and yield for successive transfers of nanotubes.

According to one aspect of the invention, more than two transfers of nanotubes from source substrates to target substrates are feasible. This approach facilitates fabrication of ultra-high-density nanotubes and ultra-high-density nanotube grids or fabrics. The ultra-high-density nanotubes and ultra-high-density nanotube grids or fabrics fabricated in accordance with embodiments of the invention can be used, for example, to make high-performance carbon nanotube field effect transistors (CNFETs) and low cost, highly-transparent, and low-resistivity electrodes for solar cell and flat panel display applications. As used herein, ultra-high-density refers to greater than or equal to 100 carbon nanotubes/µm, and more preferably greater than or equal to 250 carbon nanotubes/µm.

By carrying out the multiple nanotube transfer technique in accordance with an embodiment of the subject invention for the desired number of times, nanotubes with ultra-high density can be produced.

In one embodiment, ultra-high density and aligned nanotubes manufactured in accordance with an embodiment of the subject technique can be used to make high performance CNFETs.

Since the subject techniques of multiple nanotube transfer do not pose any limitation on the orientation relationship between tubes in different transfer, through varying the orientation of nanotube in different transfers, a nanotube grid or nanotube fabric can be produced.

A nanotube grid or fabric produced using the subject multiple nanotube transfer technique can be made highly conductive by performing nanotube transfer for an arbitrary number of times until the sheet resistance of the grid or fabric reduces to the desired level. The shape of the electrode can be defined by optical lithography with subsequent plasma etching and photoresist stripping. This low-cost, highly transparent, and low resistivity carbon nanotube electrode can be used in solar cell or flat panel display applications.

The unique high density nanotubes, grids, and fabrics produced by the processes described herein can be used for high-performance electronics and carbon nanotube based materials.

To facilitate the multiple nanotube transfer of the invention, a plasma exposure process is performed on the target substrate during stages of a transfer printing process, such as when the target substrate is provided with the transferred nanotubes and carrier material.

Carbon nanotubes used in accordance with embodiments of the present invention can be grown on a source substrate using any suitable method known in the art. Growth methods can include those for aligned SWNTs and random network SWNTs. The source substrate can be Quartz or any suitable substrate for growth of the carbon nanotubes. A material that can effectively encapsulate the carbon nanotubes while providing a mechanically strong structural element for peel-pack can then be deposited on the carbon nanotubes. This material can be referred to as a carrier material. The carrier material should be capable of being easily removed from the carbon nanotubes with minimal to no degradation of the properties of the carbon nanotubes. In a specific embodiment, the carrier material is or includes gold.

An adhesive tape or stamp can be used to transfer the carrier material coated carbon nanotubes to a target substrate. The target substrate can include, but is not limited to, silicon, silicon dioxide, silicon nitride, quartz and glass. By using this printing approach, controlled arrangements of carbon nanotubes can be achieved. The nanotube orientation and the number of transfers are not limited.

In one embodiment, a thermal tape can be applied to the carrier material coated carbon nanotubes and then peeled back to remove the carrier material coated carbon nanotubes from the growth substrate. The carrier material coated carbon nanotubes are van der Waals adhered to the surface of the adhesive tape.

The nanotubes can be transferred to the target substrate by applying the adhesive tape having the carrier material coated carbon nanotubes onto the target substrate. Before transferring the carbon nanotubes onto the target substrate, the target substrate is cleaned. According to one embodiment, an initial plasma process can be performed with respect to the target substrate to clean the substrate. In a specific embodiment, the initial plasma process is an oxygen plasma process.

After the adhesive tape is pressed to the target substrate, the adhesive tape can be removed to leave the carrier coated carbon nanotubes on the target substrate. By using a thermal release adhesive tape, the adhesive tape can be removed by heating the structure to a temperature where the adhesive tape loses adhesion. This can be accomplished by using, for example, a hot plate or an oven. The removal of the adhesive tape leaves the carrier material and carbon nanotubes on the target substrate.

According to an exemplary embodiment of the invention, multiple nanotube transfers, such as in cases of performing at least three transfer printings onto a target substrate while maintaining a production-worthy device yield, is made possible by repetitive plasma processing of the target substrate at particular stages of the transfer process.

In one embodiment, the target substrate is subject to the plasma processing when the carrier material and carbon nanotubes are left on the substrate after the removal of the adhesive tape. The plasma processing can be a two stage process. One of the two stages involves an oxygen plasma process, which can be similar to an initial target cleaning process, and the other of the two stages involves a partial etching or cleaning of the carrier material. In a specific embodiment, one stage is exposing the target substrate, which has the carrier material coated carbon nanotubes, to oxygen plasma. The other stage is exposing the target substrate, which has the carrier material coated carbon nanotubes, to a plasma that is capable of at least partially etching the carrier material. For example, where the carrier material is gold, the plasma is argon plasma. The two stages of the plasma process can be performed in any order. For example, the first stage can be the oxygen plasma process and the second stage can be the carrier related plasma process. Alternatively, the first stage can be the carrier related plasma process and the second stage can be the oxygen plasma process. In yet another embodiment, the oxygen plasma process can be omitted.

After the cleaning process performed by using the two stage plasma processing, the carrier material is removed. The removal of the carrier material leaves the carbon nanotubes intact on the target substrate. A wet etching process may be used to remove the carrier material. For example, when the carrier material is gold, a gold etchant, such as the commercially available gold etchant TFA by Transene, is used to remove the gold while leaving the carbon nanotubes intact on the target substrate.

In a further embodiment, the target substrate undergoes the plasma processing after the carrier material is removed from the carbon nanotubes and a subsequent layer is formed on the carbon nanotubes. The plasma processing at this step can also be a two stage process. One of the two stages involves an oxygen plasma process, and the other of the two stages involves using a plasma capable of at least partially etching the carrier material. For example, where the carrier material is gold, the plasma is argon plasma. For the two stage plasma process, the two stages can be performed in any order. For example, the first stage can be the oxygen plasma process and the second stage can be the carrier related plasma process. Alternatively, the first stage can be the carrier related plasma process and the second stage can be the oxygen plasma process. In yet another embodiment, the oxygen plasma process can be omitted.

The plasma processing in accordance with embodiments of the invention prepares the target substrate for successive carbon nanotube transfers. By performing the plasma processing in accordance with the invention, wafer-scale nanotube multiple transfer is feasible while maintaining adequate yield. Wafer-scale transfer can be important for both time and cost reduction when this carbon nanotube transfer technology is used in manufacturing.

In yet another embodiment, three-dimensional integration of CNFETs can be accomplished by forming an insulating dielectric on CNFETs already formed on a target substrate, performing a two-stage plasma processing with respect to the insulating dielectric, and then forming a second layer of carbon nanotube field effect transistors. By repeating this procedure, an arbitrary number of layers of CNFETs can be produced. The two stage plasma processing involves an oxygen plasma process and a plasma process using a plasma capable of at least partially etching the carrier material used for transferring the carbon nanotubes to the target substrate in previous or subsequent processes. For example, where the carrier material is gold, the plasma for the plasma processing is argon plasma. For the two stage plasma process, the two stages can be performed in any order. In yet another embodiment, the oxygen plasma process can be omitted (resulting in a one-stage plasma processing). In certain embodiments, each transistor layer can be accomplished using the subject multiple carbon nanotube transfer process.

Figure 1:
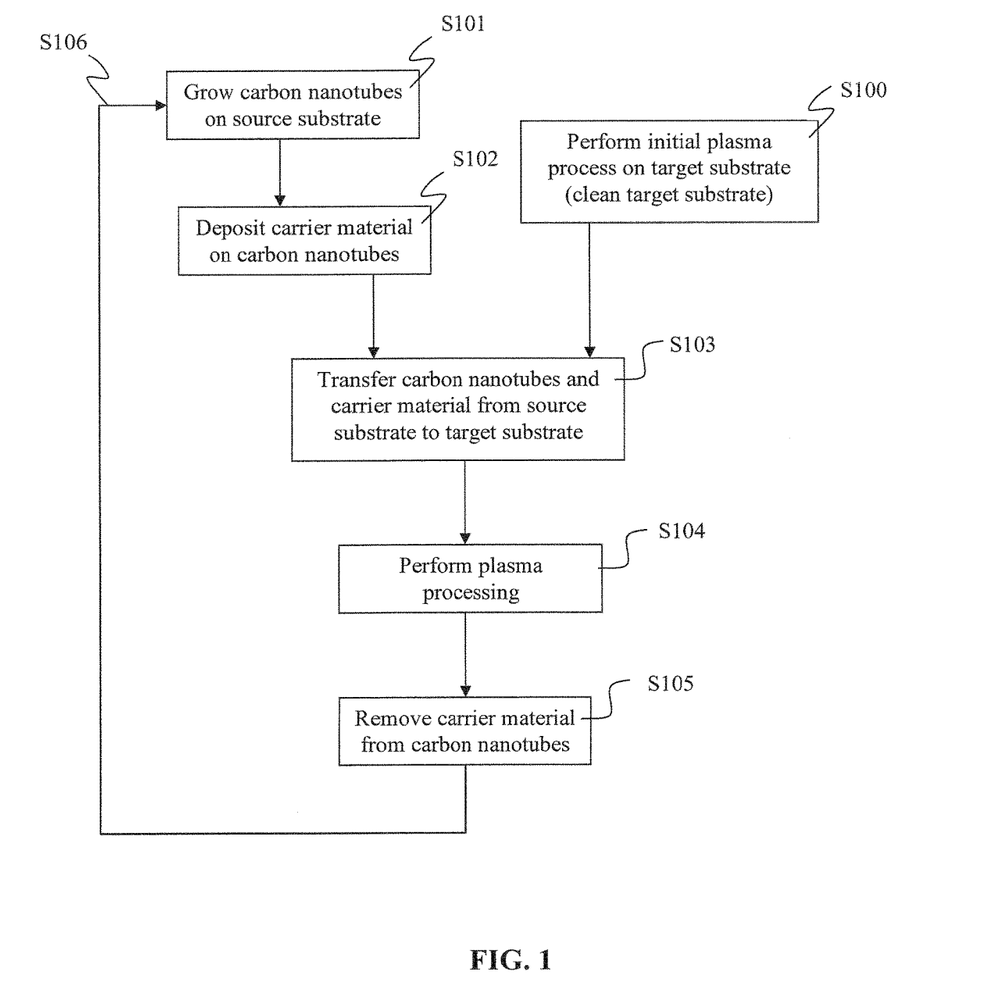
FIG. 1 shows a block diagram of a process flow of a carbon nanotube transfer process in accordance with an embodiment of the subject invention.

FIG. 1 shows a block diagram of a process flow of a carbon nanotube transfer process in accordance with an embodiment of the subject invention.

Referring to FIG. 1, in one example process flow, carbon nanotubes are grown on a source substrate (S101) and a carrier material such as gold is deposited on the carbon nanotubes (S102). The carrier material is used to effectively encapsulate the exposed parts of the carbon nanotubes to enable efficient removal from the growth substrate.

A target substrate upon which the carbon nanotubes are to be transferred is prepared. Before transferring the carbon nanotubes, an initial plasma process can be performed (S100) to clean the target substrate. The initial plasma process (S100) can be an oxygen plasma treatment.

The carbon nanotubes and carrier material are transferred from the source substrate to the target substrate (S103). In a specific embodiment, the carbon nanotubes are transferred onto the target substrate by using a thermal adhesive. The thermal adhesive adheres to the carrier material, allowing the carbon nanotubes to be peeled from the growth substrate. The adhesive with the carrier material and carbon nanotubes is applied to the target substrate. By using a thermal adhesive, the adhesive can be removed by a heat treatment to leave the carbon nanotubes and carrier material on the target substrate.

A plasma processing is then performed on the exposed carrier material coated carbon nanotubes (S104). In one embodiment, the plasma processing (S104) involves a first plasma process of an oxygen plasma process and a second plasma process of an argon plasma process. The gas flow rate, chamber pressure, radio frequency power and amount of etching time can be selected to clean the substrate. In a specific embodiment, the oxygen plasma process conditions are flow rate of 20 sccm, chamber pressure of 25 mTorr, radio frequency power of 55 W, and exposure time of 1 to 5 minutes; and the argon plasma process conditions are flow rate of 15 sccm, chamber pressure of 12 mTorr, radio frequency power of 100 W, and exposure time of 2 to 10 minutes. Of course, embodiments are not limited thereto. For example, the conditions can be varied while still accomplishing the cleaning of the substrate. In addition, the order of the first and second plasma processes can be reversed.

Further, where the carrier material is not gold, the argon plasma can be replaced with a plasma capable of partially etching the carrier material that is not gold.

After performing the first and second plasma process, the carrier material is removed from the carbon nanotubes (S105). For a gold carrier material, the target substrate is dipped into a gold etchant to remove the gold film. Subsequent carbon nanotube transfers (S106) can be performed following the steps S101-S105 until a desired carbon nanotube density is reached on the target substrate.

Figure 2:
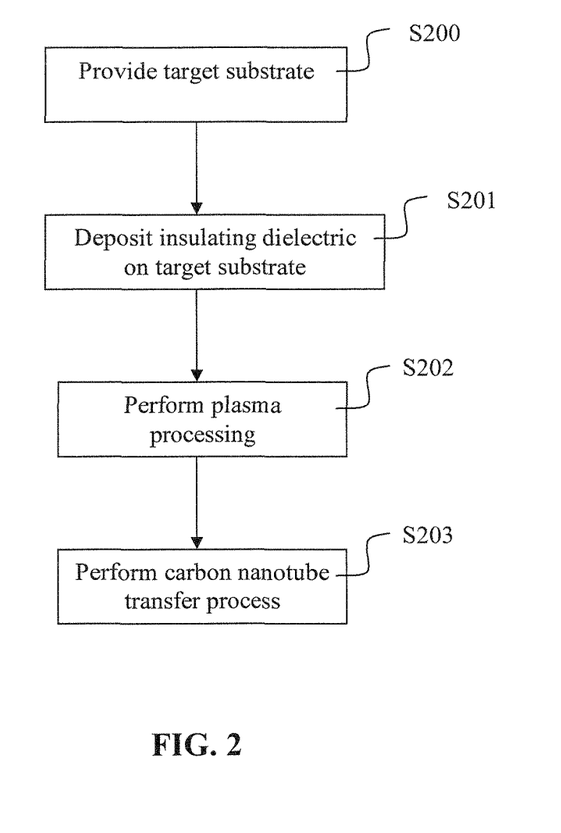
FIG. 2 shows a block diagram of a process flow of a three-dimensional integration of carbon nanotube field effect transistors in accordance with another embodiment of the subject invention.

FIG. 2 shows a block diagram of a process flow of a three-dimensional integration of carbon nanotube field effect transistors in accordance with another embodiment of the subject invention.

Referring to FIG. 2, a target substrate can be provided (S200). The target substrate can be provided with a CNFET or integrated circuit using CNFETs. In one embodiment, the CNFETs are formed by performing a carbon nanotube transfer process such as described with respect to FIG. 1. Once the CNFET structure is complete, an insulating dielectric can be formed on the target substrate having the CNFETs (S201). Then, a plasma processing is performed on the insulating dielectric (S202). The plasma processing (S202) can involve a first plasma process and a second plasma process. In one embodiment, the first plasma process is an oxygen plasma process and the second plasma process is an argon plasma process. The gas flow rate, chamber pressure, radio frequency power and amount of etching time can be selected to clean the substrate. In a specific embodiment, the oxygen plasma process conditions are flow rate of 20 sccm, chamber pressure of 25 mTorr, radio frequency power of 55 W, and exposure time of 1 to 5 minutes; and the argon plasma process conditions are flow rate of 15 sccm, chamber pressure of 12 mTorr, radio frequency power of 100 W, and exposure time of 2 to 10 minutes. Of course, embodiments are not limited thereto. For example, the conditions can be varied while still accomplishing the cleaning of the substrate. Once the first and second plasma processes are performed, the target substrate is ready for transfer of carbon nanotubes (S203). In certain embodiments, the plasma processing can omit the oxygen plasma process. The carbon nanotube transfer process in S203 can be carried out as described with respect to the process of FIG. 1. CNFETs can be formed on the transferred carbon nanotubes. Steps S200-S203 can be performed an arbitrary number of times to create any desired number of CNFET layers.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE 1

Wafer-Scale Multiple Carbon Nanotube Transfer Technology

Carbon nanotubes (CNTs) are grown on a quartz substrate. Gold film is then evaporated onto the source substrate using ebeam evaporation. For the first transfer, the target substrate is exposed to oxygen plasma with gas flow rate being 20 sccm, chamber pressure being 25 mTorr, and radio frequency power being 55 W for 3 minutes to clean the target substrate. Thermal release adhesive tape (such as from Nitto Denko) is then pressed onto the source substrate which is covered with nanotubes and gold film. The tape is peeled off physically from the source substrate. This tape, with the gold film containing embedded CNTs is pressed against the target substrate. The composite structure is heated on a hotplate or an oven to cause the tape to lose thermal adhesion and allow for detachment of the tape from the gold film, leaving the film and nanotubes on the target substrate.

The target substrate, which has nanotube and gold film on it, is first exposed to oxygen plasma with gas flow rate being 20 sccm, chamber pressure being 25 mTorr, and radio frequency power being 55 W for 3 minutes. After that, the same target substrate is exposed to argon plasma with gas flow rate being 15 sccm, chamber pressure being 12 mTorr, and radio frequency power being 100 W for another 4 minutes.

These two plasma exposures clean the target substrate which makes the substrate suitable for subsequent nanotube transfer.

After that, the target substrate is dipped into gold etchant to remove the gold film. After this gold etching procedure, the nanotubes are left intact onto the target substrate thus completing the transfer process.

Successive transfer of nanotubes can then be performed in the exact same way as the first transfer.

EXAMPLE 2

Technology of Making Wafer-Scale Aligned and Ultra-High Density Nanotubes

By carrying out the multiple nanotube transfer technique as described in Example 1 for the desired number of times, nanotubes with ultra-high density can be produced. Provided that the nanotubes are grown straight and aligned to each other, ultra-high density and aligned nanotubes can be obtained.

EXAMPLE 3

Technology of Making Wafer-Scale Nanotube Grid or Nanotube Fabrics

Since the technique of multiple nanotube transfer as described in Example 1 does not pose any limitation on the orientation relationship between tubes in different transfer, through varying the orientation of nanotube in different transfers, a nanotube grid or a nanotube fabric can be produced.

EXAMPLE 4

High-Performance Carbon Nanotube Field Effect Transistor Making Use of Ultra-High Density Nanotubes Ultra-high density and aligned nanotubes as produced in Example 2 can be used to make high performance carbon nanotube field-effect transistors.

In further examples utilizing another carbon nanotube layer, after coating the carbon nanotubes produced as in Example 2 on the target substrate with a protective layer, the target substrate is cleaned again first with oxygen plasma with gas flow rate being 20 sccm, chamber pressure being 25 mTorr, radio and frequency power being 55 W for 3 minutes, and then cleaned with argon plasma with gas flow rate being 15 sccm, chamber pressure being 12 mTorr, and radio frequency power being 100 W for another 4 minutes.

EXAMPLE 5

Low-Cost, Highly-transparent, and Low Resistivity Electrodes for Solar Cell and Flat Panel Display Applications A nanotube grid or fabric produced using Example 2 can be made highly conductive by performing nanotube transfer for arbitrary number of times until the sheet resistance of the grid or fabric goes down to the desired level. The shape of the electrode can be defined by optical lithography with subsequent plasma etching and photoresist stripping. This low-cost, highly transparent, and low resistivity carbon nanotube electrode can then be used in solar cell or flat panel display applications.

EXAMPLE 6

Three-Dimensional Integration of Carbon Nanotube Field Effect Transistor

A carbon nanotube field effect transistor is first made on a target substrate. This CNFET can be made as described by Example 4. Then, insulating dielectric such as Plasma-Enhanced-Chemical-Vapor-Deposition (PECVD) oxide is deposited or sputtered. The insulating dielectric is then cleaned using oxygen plasma with gas flow rate being 20 sccm, chamber pressure being 25 m Torr, and radio frequency power being 55 W for 3 minutes, followed by argon plasma cleaning with gas flow rate being 15 sccm, chamber pressure being 12 mTorr, and radio frequency power being 100 W for another 4 minutes. After this cleaning procedure, nanotubes can be transferred onto this dielectric layer as described in Example 1, and carbon nanotube field effect transistors can be formed on this layer. By repeating this procedure, arbitrary number of layers of carbon nanotube field effect transistor can be produced.

Figure 3A:
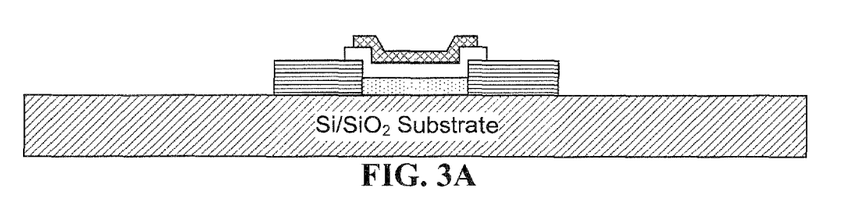
FIGS. 3A-3E show schematic representations illustrating process steps for the fabrication of three-dimensional integrated circuits utilizing carbon nanotube field effect transistors in accordance with an embodiment of the subject invention.

In a specific embodiment example illustrated in FIG. 3A, a first layer of CNFET circuits for a 3D IC, which includes an ensemble of CNFETs and interconnects that share both the same substrate and the same top passivation layer, can be fabricated using the wafer-scale CNFET fabrication process described by N. Patil et al. in "Integrated Wafer-Scale Growth and Transfer of Directional Carbon Nanotubes and Misaligned-Carbon-Nanotube-Immune Logic Structures," (*Proc. Symp. VLSI Tech., pp.* 205-206, 2008) and N. Patil et al. in "Wafer-Scale Growth and Transfer of Aligned Single-Walled Carbon Nanotubes," (*IEEE Trans. Nanotechnology*, Vol. 8, pp. 498-504, 2009), which are hereby incorporated by reference in their entirety. In addition, the fabrication process can further include the steps described with respect to FIG. 1 (and in Example 4).

Figure 3B:
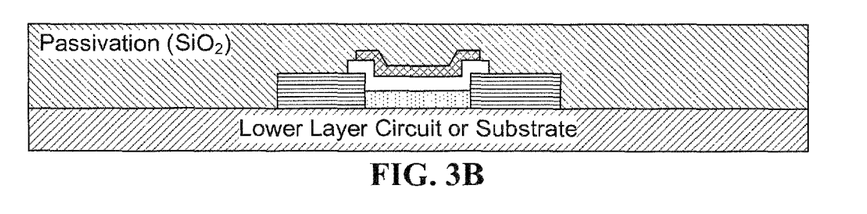

Then, as shown in FIG. 3B, an oxide (for example, $SiO_2$) is deposited as an interlayer dielectric (ILD) using PECVD. In this example, the $SiO_2$ is deposited to a thickness of 100 to 160 nm at a temperature of about 150° C. According to an embodiment of the subject invention, the ILD layer is then cleaned using oxygen plasma with gas flow rate being 20 sccm, chamber pressure being 25 m Torr, and radio frequency power being 55 W for 3 minutes, followed by argon plasma cleaning with gas flow rate being 15 sccm, chamber pressure being 12 mTorr, and radio frequency power being 100 W for another 4 minutes. After this cleaning procedure, nanotubes can be transferred onto this ILD layer.

Figure 3C:
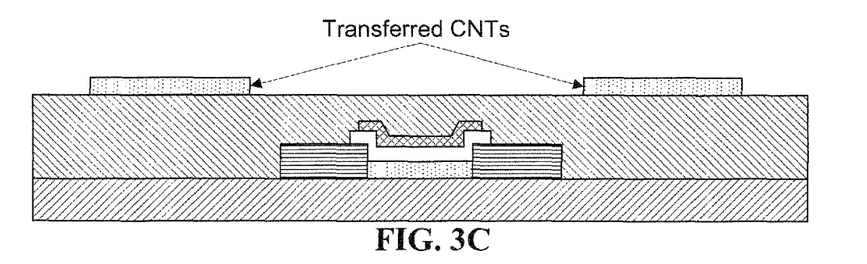

Referring to FIG. 3C, CNTs are transferred on the second layer (i.e., on top of the ILD covering the first layer of circuits. The transfer process can include the steps described with respect to FIG. 1 (and in Example 1).

Figure 3D:
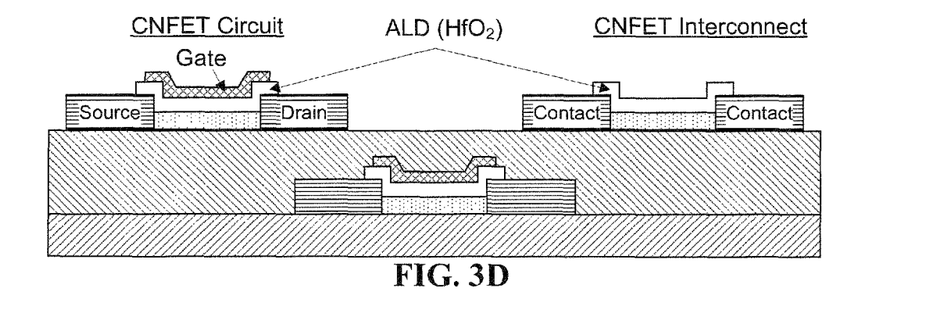

Referring to FIG. 3D, for CNTs that will be part of CNT interconnects, metal contacts are patterned; and for CNTs that will be part of CNFETs on this layer, source and drain contacts are patterned and metallic CNTs are removed. The removal of the metallic CNTs can be accomplished using for example, the electrical breakdown methods described in "Engineering Carbon Nanotubes and Nanotube Circuits Using Electrical Breakdown," by P. G. Collins et al. (*Science*, Vol. 292, pp. 706-709, 2001) and "Threshold Voltage and On-Off Ratio Tuning for Multiple-tube Carbon Nanotube FETs," by A. Lin et al. (*IEEE Trans. Nanotechnology*, Vol. 8, pp. 4-9, 2009) or other techniques such as CNT enrichment as described in "Self-Sorted. Aligned Nanotube Networks for Thin-Film Transistors," by M. C. LeMieux et al. (*Science*, Vol. 321, pp. 101-104, 2008), which are hereby incorporated by reference in their entirety. In certain embodiments, design techniques for metallic-CNT-tolerant circuits, such as ACCNT (described in "A Metallic-CNT-Tolerant Carbon Nanotube Technology Using Asymmetrically-Correlated CNTs (ACCNT)," by A. Lin, et al., *Proc. Symp. VLSI Tech., pp.* 182-183, 2009, which is hereby incorporated by reference in its entirety), may also be used.

In a specific embodiment, a layer of $HfO_2$ is deposited through Atomic Layer Deposition (ALD) of oxide on the CNT wires to inhibit the CNTs from being destroyed during PECVD for the ILD on top of the current layer of CNFET.

Figure 3E:
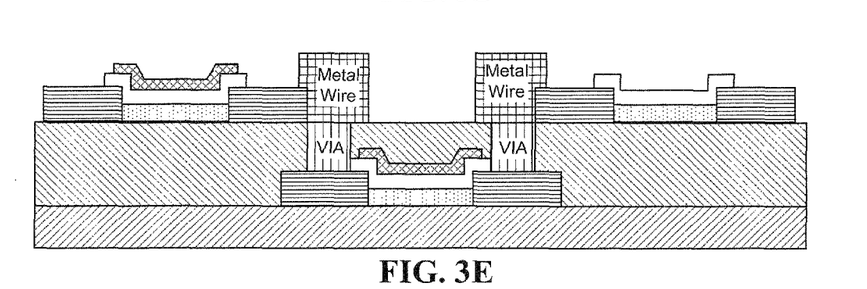

Referring to FIG. 3E, vias are etched through the ILD and filled with metal to provide electrical access to the lower layer covered by ILD. The metal contacts may be formed of a bi-layer of Titanium and Platinum. Metal wires are also patterned to provide electrical connection among circuit elements of the topmost layer of the 3D ICs.

The steps described with respect to FIGS. 3B to 3E are repeated to monolithically integrate additional layers of CNFET-based monolithic 3D ICs.

In all the described cleaning procedures, same results obtained herein maybe reproduced with a variation of the gas flow rate, the chamber pressure, the radio frequency power and the amount of etching time. Furthermore, different model of the thermal release tape maybe used.

Accordingly, the multiple carbon nanotube transfer process in accordance with embodiments of the present invention allows for production of ultrahigh density carbon nanotubes and highly transparent and low-resistivity nanotube grids. The ultrahigh density carbon nanotubes are commercially applicable to production of high-performance carbon nanotube field effect transistor; and the nanotube grids allow for the production of low-cost, highly-transparent and low resistivity electrodes applicable in solar cells and flat-panel displays.

Embodiments of the invention include devices, structures, and carbon nanotube materials produced by the processes described herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. In addition to variations and modifications in the component parts and/or arrangements, alternative uses will also be apparent to those skilled in the art.

What is claimed is:

1. A method of forming a carbon nanotube-based element, the method comprising:
   growing carbon nanotubes on a source substrate;
   depositing a carrier material on the source substrate to coat the carbon nanotubes;
   applying an adhesive tape to the source substrate and removing the adhesive tape from the source substrate such that the carrier material and carbon nanotubes are removed with the adhesive tape;
   applying the adhesive tape having the carrier material and carbon nanotubes onto a target substrate;
   releasing the adhesive tape from the carrier material and carbon nanotubes such that the carrier material and carbon nanotubes remain on the target substrate;
   exposing the target substrate having the carrier material and the carbon nanotubes to a first plasma processing; and
   removing the carrier material from the target substrate after performing the first plasma processing,
   wherein the performing of the first plasma processing comprises exposing the target substrate to a plasma at conditions capable of partially etching the carrier material, and wherein said method further comprises repeating at least two times:
   growing additional carbon nanotubes on a second source substrate;
   depositing a second carrier material on the second source substrate to coat the additional carbon nanotubes:
   applying a second adhesive tape to the second source substrate and removing the second adhesive tape from the second source substrate such that the second carrier material and additional carbon nanotubes are removed with the second adhesive tape;
   applying the second adhesive tape having the second carrier material and additional carbon nanotubes onto the target substrate having the carbon nanotubes after the removing of the carrier material from the target substrate;
   releasing the second adhesive tape from the second carrier material and additional carbon nanotubes such that the second carrier material and additional carbon nanotubes remain on the target substrate;
   exposing the target substrate having the second carrier material and the additional carbon nanotubes to a second plasma processing; and
   removing the second carrier material from the target substrate after performing the second plasma processing;
   and obtaining, after the performance of these step, an ultra-high density carbon nanotube-based element having a density of carbon nanotubes of greater than or equal to 250 carbon nanotubes/µm.

2. The method of forming the carbon nanotube-based element according to claim 1, wherein the first plasma processing and the second plasma processing are performed under the same process conditions.

* * * * *

UNITED STATES PATENT AND TRADEMARK OFFICE
CERTIFICATE OF CORRECTION

PATENT NO.           : 9,748,421 B2                                    Page 1 of 1
APPLICATION NO.      : 12/718418
DATED                : August 29, 2017
INVENTOR(S)          : Subhasish Mitra et al.

It is certified that error appears in the above-identified patent and that said Letters Patent is hereby corrected as shown below:

In the Claims

Column 10,
Line 62, "of these step" should read --of these steps--.

Signed and Sealed this
Twentieth Day of March, 2018

Andrei Iancu
*Director of the United States Patent and Trademark Office*